(12) United States Patent
Jang et al.

(10) Patent No.: US 10,477,743 B2
(45) Date of Patent: Nov. 12, 2019

(54) MAGNETIC FIELD SHIELDING SHEET AND WIRELESS POWER TRANSMITTING MODULE INCLUDING SAME

(71) Applicant: AMOSENSE CO.,LTD, Chungcheongnam-do (KR)

(72) Inventors: Kil Jae Jang, Seongnam-si (KR); Dong Hoon Lee, Yongin-si (KR); Min Sik Jang, Incheon (KR)

(73) Assignee: AMOSENSE CO., LTD, Cheonan-si, Chungcheongnam-do (KR)

( * ) Notice: Subject to any disclaimer, the term of this patent is extended or adjusted under 35 U.S.C. 154(b) by 269 days.

(21) Appl. No.: 15/541,463

(22) PCT Filed: Dec. 29, 2015

(86) PCT No.: PCT/KR2015/014391
§ 371 (c)(1),
(2) Date: Jul. 3, 2017

(87) PCT Pub. No.: WO2016/111496
PCT Pub. Date: Jul. 14, 2016

(65) Prior Publication Data
US 2018/0279517 A1 Sep. 27, 2018

(30) Foreign Application Priority Data

Jan. 5, 2015 (KR) .................. 10-2015-0000572
Mar. 26, 2015 (KR) .................. 10-2015-0042149

(51) Int. Cl.
*H01F 38/14* (2006.01)
*H05K 9/00* (2006.01)
(Continued)

(52) U.S. Cl.
CPC ......... *H05K 9/0075* (2013.01); *H01F 27/365* (2013.01); *H01F 38/14* (2013.01);
(Continued)

(58) Field of Classification Search
CPC ............ H01Q 1/243; H01Q 7/00; H01Q 7/06; H01Q 21/28; H01Q 1/38; H01Q 1/521;
(Continued)

(56) References Cited

U.S. PATENT DOCUMENTS

| 9,859,051 B2 * | 1/2018 | Ren .................. H01F 38/14 |
| 2008/0164876 A1 * | 7/2008 | Sakakura ............. G01R 33/385 324/318 |

(Continued)

FOREIGN PATENT DOCUMENTS

| JP | 2010-041906 A | 2/2010 |
| JP | 2014-036116 A | 2/2014 |

(Continued)

OTHER PUBLICATIONS

ISA/KR, International Search Report dated Apr. 18, 2016, issued in International Application No. PCT/KR2015/014391, total 4 pages with English translation.

(Continued)

*Primary Examiner* — Alfonso Perez Borroto
*Assistant Examiner* — Esayas G Yeshaw
(74) *Attorney, Agent, or Firm* — Masuvalley & Partners

(57) ABSTRACT

A magnetic field shielding sheet and a wireless power transfer module that includes the same are provided. The magnetic field shielding sheet, according to an exemplary embodiment of the present invention, which is applied to a combo-type antenna unit that includes at least two antennas using different frequency bands of magnetic fields, comprises: a first sheet layer that includes a metal component that shields a first frequency band of a magnetic field and concentrates the magnetic field in a designated direction; a second sheet layer that shields a second frequency band of a magnetic field and concentrates the magnetic field in a designated direction; and a micro-piece separation and oxi- (Continued)

dation preventing member provided on a side surface of the first sheet layer in order to prevent a micro-piece from being separated from the side surface of the first sheet or to prevent the side surface from being oxidized. According to the present invention, by virtue of the micro-piece separation and oxidation preventing member provided on the side surface of the first sheet layer, it is possible to prevent the side surface from being oxidized and to prevent short-circuiting due to particles.

20 Claims, 5 Drawing Sheets

(51) Int. Cl.
*H01F 27/36* (2006.01)
*H01Q 7/06* (2006.01)
*H01Q 21/28* (2006.01)
*H02J 50/12* (2016.01)
*H02J 50/70* (2016.01)
*H01Q 1/38* (2006.01)

(52) U.S. Cl.
CPC ............... *H01Q 1/38* (2013.01); *H01Q 7/06* (2013.01); *H01Q 21/28* (2013.01); *H02J 50/12* (2016.02); *H02J 50/70* (2016.02); *H05K 9/0088* (2013.01)

(58) Field of Classification Search
CPC ......... H01F 27/2804; H01F 2027/2809; H01F 27/365; H01F 38/14; H05K 9/0075; H05K 9/0088; H02J 50/12; H02J 50/70; H04B 5/0031; H04B 5/0037
See application file for complete search history.

(56) References Cited

U.S. PATENT DOCUMENTS

| | | | | |
|---|---|---|---|---|
| 2008/0303479 A1* | 12/2008 | Park | ................. | H02J 7/025 320/108 |
| 2012/0032632 A1* | 2/2012 | Soar | ................. | H01F 38/14 320/108 |
| 2014/0035379 A1* | 2/2014 | Stevens | ................. | H02J 7/0013 307/104 |
| 2014/0143933 A1* | 5/2014 | Low | ................. | G04C 10/00 2/170 |
| 2014/0312702 A1* | 10/2014 | Uchida | ................. | H02J 17/00 307/80 |
| 2015/0326028 A1* | 11/2015 | Suzuki | ................. | H02J 7/025 307/104 |
| 2017/0133880 A1* | 5/2017 | Wakisaka | ................. | H02J 50/80 |
| 2018/0062430 A1* | 3/2018 | Matsumoto | ................. | H02J 7/00 |

FOREIGN PATENT DOCUMENTS

| | | | | |
|---|---|---|---|---|
| JP | 036116 A | * | 2/2014 | ............ H01F 17/04 |
| JP | 2014-183469 A | | 9/2014 | |
| JP | 183469 A | * | 9/2014 | ............ H01Q 1/38 |
| KR | 10-1209979 B1 | | 12/2012 | |
| KR | 10-2013-0072181 A | | 7/2013 | |
| KR | 10-2014-0076778 A | | 6/2014 | |
| KR | 10-2014-0101665 A | | 8/2014 | |
| WO | WO2014/137151 A1 | | 9/2014 | |
| WO | WO2016/111496 A1 | | 7/2016 | |

OTHER PUBLICATIONS

Intellectual Property India, Examination Report dated Jul. 26, 2019 in India Patent Application No. 201717023398, 6 pages.

* cited by examiner

MAGNETIC FIELD SHIELDING SHEET AND WIRELESS POWER TRANSMITTING MODULE INCLUDING SAME

RELATED APPLICATIONS

This application is the U.S. National Phase application under 35 U.S.C. § 371 of International Patent Application No. PCT/KR2015/014391, International Filing Date Dec. 29, 2015, entitled "MAGNETIC FIELD SHIELDING SHEET AND WIRELESS POWER RANSMITTING MODULE INCLUDING SAME"; which claims priority to Korean Patent Application No. 10-2015-0000572 filed on Jan. 5, 2015, and Korean Patent Application No. 10-2015-0042149 filed on Mar. 26, 2015, which are hereby expressly incorporated by reference in their entireties for all purposes.

TECHNICAL FIELD

The present invention relates to a magnetic field shielding sheet, and more particularly, to a magnetic field shielding sheet in which, when a shielding sheet is made of a magnetic material including a metal component, oxidation of a side surface thereof exposed to the outside is prevented and separation of a micro-piece from the side surface is prevented, and a wireless power transfer module including the same.

BACKGROUND ART

Recently, various functions such as radio frequency identification (RFID), near field communication (NFC), wireless power charging (WPC), an interactive pen tablet function, and the like have been added to portable terminals such as cellular phones, table PCs, and the like.

NFC refers to a technique in which data is transmitted between terminals at a close distance of 10 cm using a non-contact type near field communication module that uses a 13.56 MHz frequency band as one of RFIDs which are electronic tags. NFC is being widely used not only for mobile payment but also for a device for transmitting good information or travel information to visitors in supermarkets and general stores using a file transferring method, a transportation device, an access control lock device, and the like.

Also, in "Android Beam," which is provided in smart phones recently announced by Google, a mobile payment function and a function of transferring photos, business cards, files, maps, web sites, etc. from one phone to another are provided as NFC-based short-range information transmitting and receiving functions.

In addition, a wireless charging function for charging an embedded battery in a wireless manner is provided in a portable terminal. The wireless charging function is performed by a wireless power receiving module embedded in the portable terminal and a wireless power transmitting module which supplies power to the wireless power receiving module.

Recently, a hybrid-type (combo-type) antenna unit including an antenna for NFC and a Wireless Power Consortium (WPC) (or Alliance for Wireless Power (A4WP)) antenna for wireless charging of a battery is installed in a portable terminal such as a smart phone or the like.

Since such a hybrid-type antenna unit uses a magnetic field, a magnetic field ranging from 100 kHz to tens of MHz is generated in a process of performing near field communication with an adjacent portable terminal or in a process of performing a wireless charging function for charging a battery.

Accordingly, in a wireless power transfer module to which the hybrid-type antenna unit is applied, a magnetic field shielding sheet in which a first magnetic sheet and a second magnetic sheet are stacked is used, and thus performance of near field communication and performance of wireless charging are simultaneously improved.

In a process of manufacturing a magnetic field shielding sheet through a stamping process after stacking a first magnetic sheet and a second magnetic sheet, a stamped surface is exposed. When the magnetic field shielding sheet is applied to a product in a state in which the stamped surface is exposed to the outside, a problem that micro-pieces are separated from the stamped surface to short-circuit an electronic circuit occurs.

Meanwhile, currently, a salt spray test, which is a type of reliability test, is being strengthened to test reliability of electronic products such as portable terminals and the like.

Accordingly, when the shielding sheet is made of a magnetic material including a metal component, there is a problem in that the exposed surface is oxidized due to a penetration of moisture or the like when a reliability test is performed so that the shielding sheet fails to pass the reliability test.

DISCLOSURE

Technical Problem

The present invention is directed to providing a magnetic field shielding sheet in which, when a shielding sheet is made of a magnetic material including a metal component, oxidation of an exposed surface of the shielding sheet is prevented or separation of a micro-piece of the metal component from the exposed surface is prevented to improve reliability of a product, and a wireless power transfer module including the same.

Technical Solution

One aspect of the present invention provides a magnetic field shielding sheet, which is applied to a combo-type antenna unit including at least two antennas using magnetic fields of different frequency bands, the magnetic field shielding sheet including a first sheet layer configured to shield a magnetic field of a first frequency band and concentrate the magnetic field in a designated direction and including a metal component, a second sheet layer configured to shield a magnetic field of a second frequency band and concentrate the magnetic field in a designated direction, and a micro-piece separation and oxidation preventing member provided on a side surface of the first sheet layer to prevent separation of a micro-piece from the side surface of the first sheet layer or prevent oxidation of the side surface.

The micro-piece separation and oxidation preventing member may be a protective film or a coating layer.

The first sheet layer may have the same size as the second sheet layer. In this case, the micro-piece separation and oxidation preventing member may include a first portion which covers an upper surface of the first sheet layer and a second portion which extends from the first portion to cover the side surface of the first sheet layer, and the second portion may extend to cover a side surface of the second sheet layer.

The first sheet layer may have a smaller size than the second sheet layer. In this case, the micro-piece separation and oxidation preventing member may include a first portion which covers an upper surface of the first sheet layer, a second portion which extends from the first portion and covers the side surface of the first sheet layer, and a third portion which extends from the second portion to cover a portion of the second sheet layer, a buffer layer may be provided on an upper surface of the second sheet layer and disposed at a periphery of the first sheet layer to surround the first sheet layer, and the second sheet layer may be provided to have a size equal to a sum of sizes of the first sheet layer and the buffer layer. Here, the buffer layer may be made of a non-magnetic material.

The magnetic field of the first frequency band may be for wireless power transfer, the magnetic field of the second frequency band may be for near field communication, the first sheet layer may be disposed to correspond to a wireless power transfer antenna, and the second sheet layer may be disposed to correspond to an near field communication antenna.

The micro-piece separation and oxidation preventing member may include a polymer resin including at least one selected from a group consisting of a wax, an epoxy resin, a melamine resin, a silicon resin, an acrylic resin, an ethylene propylene rubber resin (EPDM), and a polyvinyl alcohol resin (PVA).

The first sheet layer and the second sheet layer may be made of magnetic materials having different magnetic permeabilities. Preferably, the first sheet layer may be a ribbon sheet including at least one of an amorphous alloy and a nanocrystalline alloy, and the second sheet layer may be a ferrite sheet or a polymer sheet.

The first sheet layer may be formed by stacking ribbon sheets including at least one of an amorphous alloy and a nanocrystalline alloy in multiple layers, and the ferrite sheet may be made of a Mn—Zn ferrite or a Ni—Zn ferrite.

At least one or both of the first sheet layer and the second sheet layer may be divided into a plurality of micro-pieces.

Adjacent micro-pieces among the plurality of micro-pieces may be entirely or partially insulated, and the plurality of micro-pieces may have a size ranging from 1 μm to 3 mm and may be formed in irregular shapes.

The micro-piece separation and oxidation preventing member may be attached via an adhesive including a non-conductive component.

Another aspect of the present invention provides a wireless power transfer module including an antenna unit including a wireless power transfer antenna and an near field communication antenna, and the above-described magnetic field shielding sheet, which is disposed on one surface of the antenna unit, shields a magnetic field generated by the antenna unit, and concentrates the magnetic field in a designated direction.

The antenna unit may further include a magnetic secure transmission (MST) antenna.

A total thickness of the wireless power transfer module may range from 0.15 to 0.6 mm.

In this case, the total thickness of the wireless power transfer module may be 0.3 mm.

Still another aspect of the present invention provides a portable terminal including the above-described wireless power transfer module.

Advantageous Effects

According to the present invention, since a micro-piece separation and oxidation preventing member is provided on a side surface of a sheet layer which is exposed to the outside, it is possible to prevent the side surface of the sheet layer from being oxidized due to contact with air and/or moisture, prevent separation of micro-pieces from the side surface, and prevent short-circuiting of an internal circuit due to the separated micro-pieces.

MODES OF THE INVENTION

Figure 1:
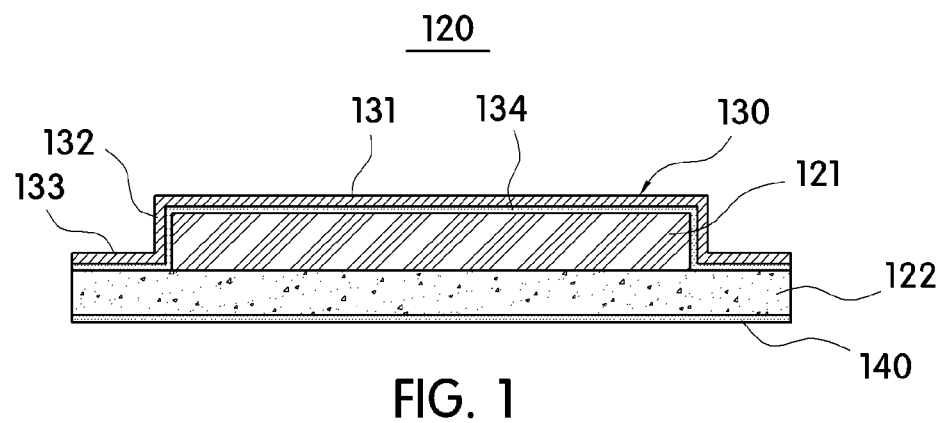
FIG. 1 is a cross-sectional view illustrating a magnetic field shielding sheet according to an embodiment of the present invention.

Hereinafter, embodiments of the present invention will be described in detail with reference to the accompanying drawings such that they can be easily performed by those skilled in the art. Embodiments of the present invention may be embodied in several different forms, and are not limited to the embodiments described herein. In addition, parts irrelevant to the description will be omitted in the drawings in order to clearly explain the embodiments of the present invention. The same or similar components are denoted by the same reference numerals throughout this specification.

Figure 4:
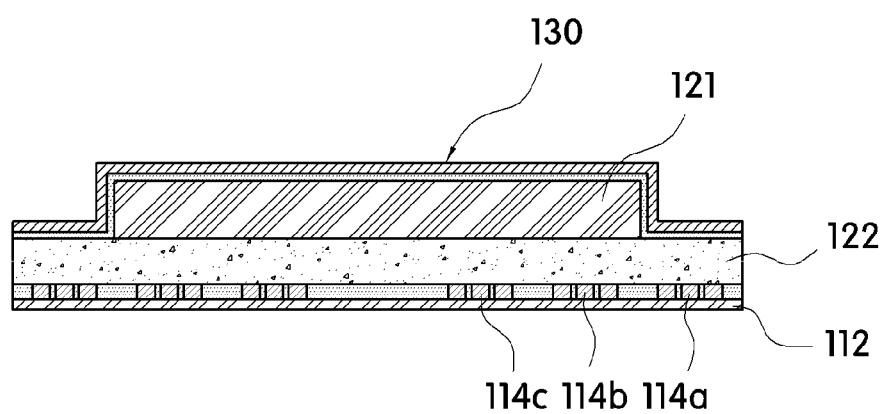
FIG. 4 is a cross-sectional view schematically illustrating a wireless power transfer module according to an embodiment of the present invention.
Figure 5:
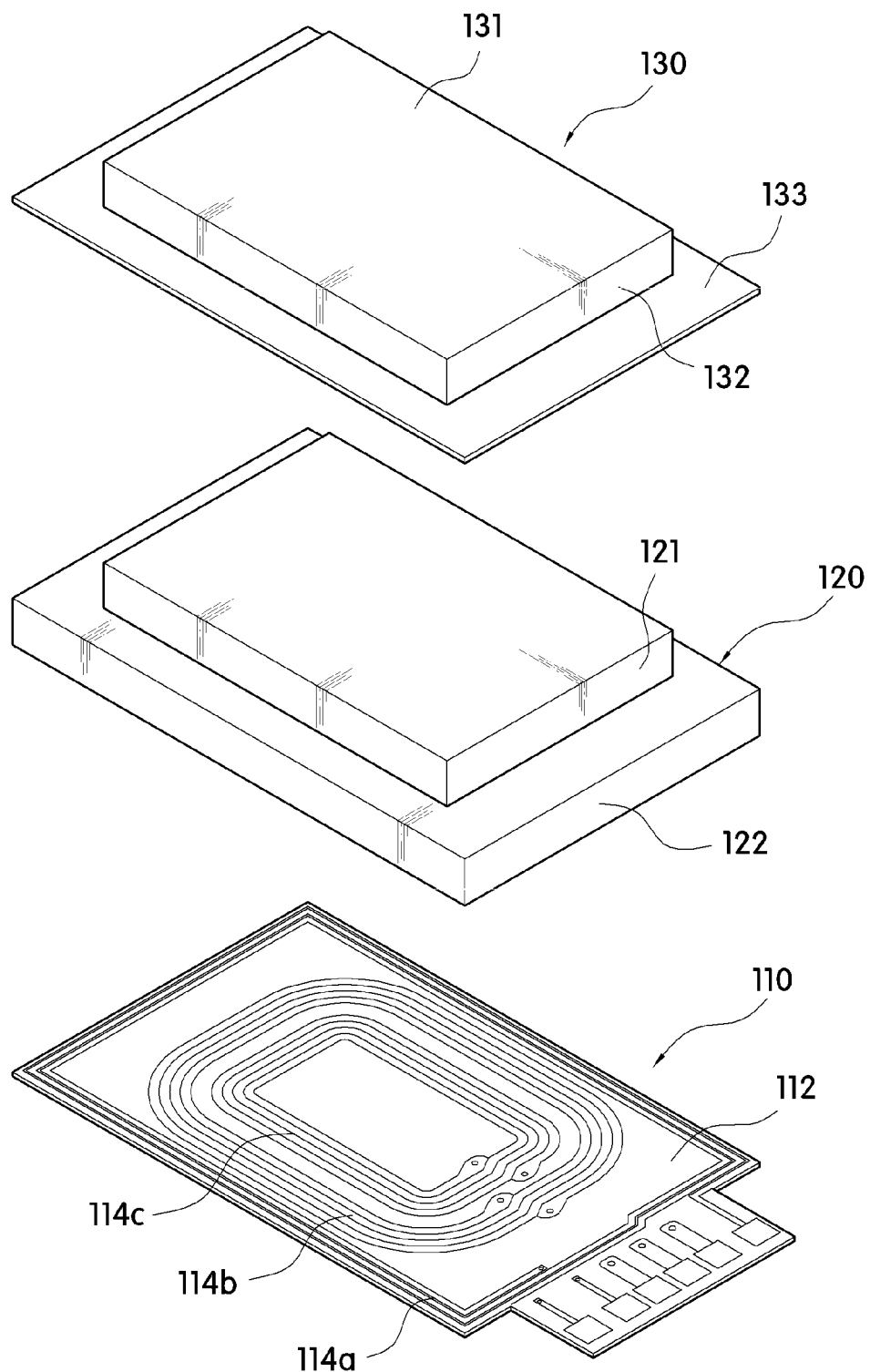
FIG. 5 illustrates an exploded view of FIG. 4.

First, referring to FIGS. 4 and 5, a wireless power transfer module 100 according to an embodiment of the present invention includes an antenna unit 110, a shielding sheet 120, and a micro-piece separation and oxidation preventing member 130.

The antenna unit 110 includes at least one antenna which works with portable electronic devices such as cellular phones, personal digital assistants (PDAs), portable media players (PMPs), tablet PCs, multimedia devices, and the like at a predetermined frequency band.

Here, the antenna may be formed with only circular, elliptical, or rectangular plate-shaped coils wound in a clockwise or counterclockwise direction, but the present invention is not limited thereto, and the antenna may be formed by patterning a conductor such as a copper foil or the like on at least one surface of a circuit board 112 or by forming a loop-shaped metal pattern on the circuit board 112 using a conductive ink.

In this case, when the antenna is formed as a metal pattern on the circuit board 112, the metal pattern may be formed on one surface or both surfaces of the circuit board 112. In addition, the antenna unit 110 may be attached to one surface of the shielding sheet 120 via one surface of the circuit board 112 on which at least one antenna is formed as a print pattern.

Here, the circuit board 112 is formed with a material having heat resistance, pressure resistance, and flexibility as an element serving as a base material on an upper surface of which at least one antenna pattern and a circuit unit are formed. In consideration of a property of such a material, a film such as a polyamide (PI) film, a polyethylene terephthalate (PET) film, or the like, which is a thermosetting polymer film, may be applied as the circuit board 112.

Meanwhile, the antenna unit 110 may be provided one on one surface of the shielding sheet 120, or may be provided multiple thereon. The antenna unit 110 may be fixed to the surface of the shielding sheet 120 via an adhesive layer.

Here, the adhesive layer may be an adhesive bond, polyvinyl chloride (PVC), rubber, a double-sided tape, or the like, and may include a conductive component.

The antenna unit 110 may be form of combo type including a plurality of antennas which operate in different frequency bands.

That is, as illustrated in FIG. 4, the antenna unit 110 may include an antenna which operates in a first frequency band and an antenna which operates in a second frequency band.

For example, the first frequency band may range from 100 to 350 kHz or 6.78 MHz, and the second frequency band may be 13.56 MHz. An antenna 114c which operates in the first frequency band may be a wireless power transfer antenna and an antenna 114a which operates in the second frequency band may be a near field communication antenna.

Here, the wireless power transfer antenna 114c serves to transmit power in a wireless manner using an inductive coupling method or a self-resonance method, and may serve as a receiving antenna (an Rx coil) or a transmitting antenna (a Tx coil).

In addition, the wireless power transfer antenna 114c may be a wireless charging antenna for charging a main battery of a portable device using the inductive coupling method or the self-resonance method, or may be a power supply antenna or a power receiving antenna for transmitting or receiving wireless power transmitted using the inductive coupling method or the self-resonance method and for using the wireless power as a driving power source.

In this case, since the near field communication antenna 114a is used in a higher frequency band than the wireless power transfer antenna 114c, the near field communication antenna 114a may be formed as a conductive pattern in a rectangular shape having a fine line width along an edge of the circuit board 112. In addition, since the wireless power transfer antenna 114c transmits power transmission and is used in a lower frequency band than the near field communication antenna 114a, the wireless power transfer antenna 114c may be formed at an inner side of the near field communication antenna 114a to have a greater line width than the near field communication antenna 114a.

In addition, the antenna unit 110 may further include a magnetic secure transmission (MST) antenna 114b in a region between the near field communication antenna 114a and the wireless power transfer antenna 114c.

The shielding sheet 120 is made of a plate-shaped member having a certain area, and serves to shield magnetic fields generated by the antenna unit 110 and to concentrate the magnetic fields in a designated direction.

In this case, the shielding sheet 120 may include different types of sheet layers 121 and 122 to improve performance of a corresponding antenna with respect to the plurality of antennas which operate in different frequency bands.

That is, the shielding sheet 120 includes the first sheet layer 121, which shields a magnetic field of the first frequency band and concentrates the magnetic field in a designated direction, and the second sheet layer 122, which shields a magnetic field of the second frequency band and concentrates the magnetic field in a designated direction.

Here, the first sheet layer 121 is disposed in a region corresponding to the antenna which operates in the first frequency band, and the second sheet layer 122 is disposed in a region corresponding to the antenna which operates in the second frequency band.

Therefore, the first sheet layer 121 may improve performance of the wireless power transfer antenna 114c which operates in the first frequency band, for example, a charging efficiency or a power transfer efficiency, and the second sheet layer 122 may improve performance of the near field communication antenna 114a which operates in the second frequency band, for example, a wireless recognition.

In this case, the first sheet layer 121 and the second sheet layer 122 may be provided to have different magnetic permeabilities. For example, the first sheet layer 121 may have a magnetic permeability ranging from 100 to 1,000, and preferably, may have a magnetic permeability of 900. However, the magnetic permeability of the first sheet layer 121 is not limited thereto, and may be appropriately changed according to design conditions.

For example, a ribbon sheet including at least one of an amorphous alloy and a nanocrystalline alloy may be used as the first sheet layer 121, and a polymer sheet or a ferrite sheet may be used as the second sheet layer 122.

As described above, the shielding sheet 120 according to the present invention may be formed by stacking a plurality of magnetic sheets having different magnetic permeabilities, and the plurality of magnetic sheets may be disposed to correspond to corresponding antennas such that performance of each of the antennas is improved.

Here, an Fe-based or Co-based magnetic alloy may be used as the amorphous alloy and the nanocrystalline alloy, and the Fe-based magnetic alloy may be preferably used in consideration of a material cost. In addition, the amorphous alloy and the nanocrystalline alloy may include a ternary alloy or a quinary alloy. For example, the ternary alloy may include Fe, Si, and B, and the quinary alloy may include Fe, Si, B, Cu, and Nb.

Also, the ferrite sheet may be made of a sintered ferrite, and may be made of a Mn—Zn ferrite or a Ni—Zn ferrite. Preferably, the ferrite sheet may be made of a sintered Ni—Zn ferrite. In addition, the polymer sheet may be made of a resin and a high magnetic permeability magnetic powder such as an amorphous alloy powder, a soft magnetic material powder, sendust.

In this case, as illustrated in FIG. 1, the first sheet layer 121 may be provided to have a relatively smaller size than the second sheet layer 122 disposed therebelow.

That is, the first sheet layer 121 has a size including a region of the wireless power transfer antenna 114c disposed at the inner side of the near field communication antenna 114a. Accordingly, the entire region of the wireless power transfer antenna 114c is covered via the first sheet layer 121, and thus the performance of the wireless power transfer antenna may be effectively improved.

In addition, since the first sheet layer 121 for improving the performance of the wireless power transfer antenna 114c is not disposed directly above the near field communication antenna 114a, the first sheet layer 121 may be prevented from affecting the performance of the near field communication antenna 114a.

For example, the first sheet layer 121 has an area not exceeding an inner area of the near field communication antenna 114a. In other words, the first sheet layer 121 has an optimum area for including the inner area of the near field communication antenna 114a and that does not include an area directly above the near field communication antenna 114a.

Here, it should be understood that, when the MST antenna 114b is provided in the antenna unit 110, the first sheet layer 121 may have a size including a region directly above the MST antenna 114b or may have a size not including the region directly above the MST antenna 114b.

Meanwhile, when the first sheet layer 121 is provided to have a smaller size than the second sheet layer 122 disposed therebelow, a buffer layer 136 may be disposed to surround a periphery of the first sheet layer 121. In this case, the sum of sizes of the first sheet layer 121 and the buffer layer 136 may be equal to the size of the second sheet layer 122 (see FIG. 2C).

In addition, it should be understood that, when the buffer layer 136 is disposed to surround a side surface of the first sheet layer 121, the buffer layer 136 may be made of a non-magnetic material so as not to affect the performance of the near field communication antenna 114a disposed directly therebelow, and may be made of the same material as the second sheet layer 122 to improve the performance of the near field communication antenna 114a.

Figure 2A:
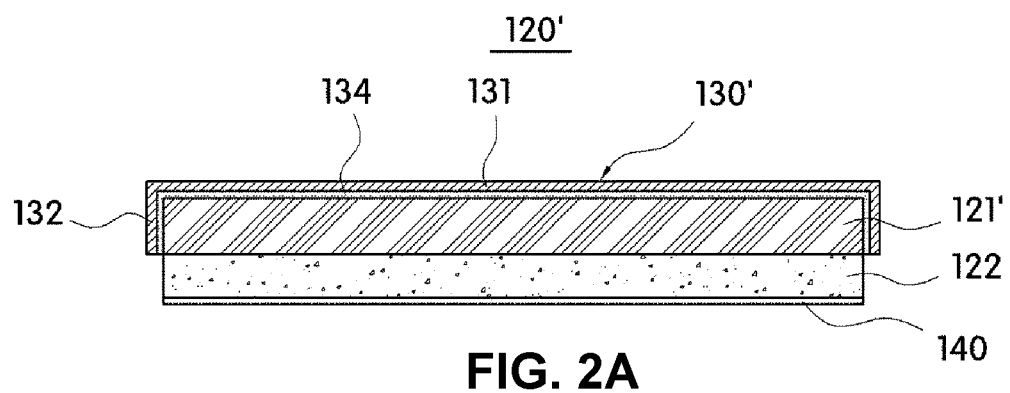
FIGS. 2A to 2D are views illustrating various modified examples of a micro-piece separation and oxidation preventing member applied to the magnetic field shielding sheet according to the embodiment of the present invention.
Figure 2B:
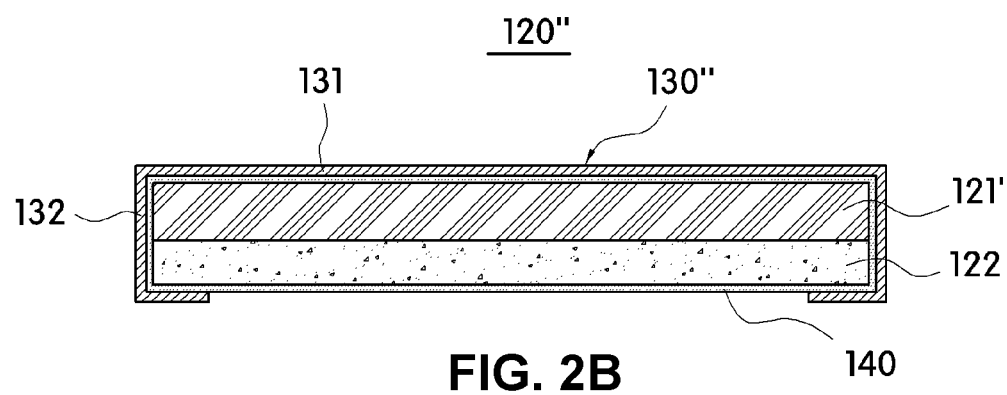

Also, it should be understood that a first sheet layer 121' may be provided to have the same size as the second sheet layer 122 for convenience of a manufacturing process (see FIGS. 2A and 2B).

Here, the same size means that widths and lengths, but not thicknesses, each have the same numerical value or that radiuses, and not the thicknesses, have the same numerical value, and it means that cross-sectional areas facing each other are the same.

Figure 3:
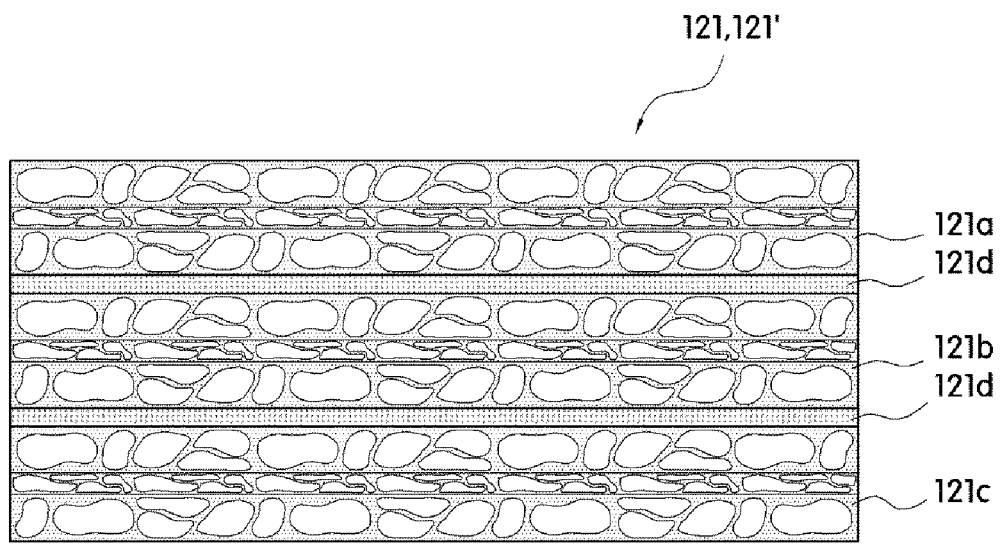
FIG. 3 is a cross-sectional view illustrating another example of a first sheet layer of the magnetic field shielding sheet according to the embodiment of the present invention.

Meanwhile, it should be understood that the first sheet layer 121 or 121' may be formed by forming plural thin ribbon sheets 121a, 121b, and 121c including at least one of an amorphous alloy and nanocrystalline alloy in multiple layers (see FIG. 3).

Here, when the first sheet layer 121 or 121' is formed by forming the plural thin ribbon sheets including at least one of an amorphous alloy and nanocrystalline alloy in multiple layers, an adhesive member 121d is interposed between the each of the ribbon sheets to integrate the multi-layered ribbon sheets.

In this case, the adhesive member 121d may include a non-conductive component, and the adhesive member 121d may be provided with an adhesive and may be provided in a form in which an adhesive is applied to one surface or both surfaces of a base member which is provided in a film form.

Meanwhile, the first sheet layer 121 or 121' for improving the performance of the wireless power transfer antenna which operates in the first frequency band may be flaked to reduce eddy current generation by increasing an overall resistance thereof, and may be divided into a plurality of micro-pieces, wherein adjacent micro-pieces among the plurality of micro-pieces may be entirely or partially insulated from each other, and each of the micro-pieces may be randomly formed in irregular shapes. Here, each of the micro-pieces may have a size ranging from 1 μm to 3 mm.

For example, when the first sheet layer 121 or 121' is formed with the thin ribbon sheet including at least one of an amorphous alloy and nanocrystalline alloy, the ribbon sheet may be flaked after being heat treated and divided into a plurality of micro-pieces, and adjacent micro-pieces among the plurality of micro-pieces may be entirely or partially insulated from each other. In this case, each of the micro-pieces may be provided to have a size ranging from 1 μm to 3 mm, and may be randomly formed in irregular shapes.

In addition, when the first sheet layer 121 or 121' is formed by forming the plurality of ribbon sheets, which are divided into a plurality of micro-pieces, in multiple layers, the multi-layered ribbon sheets may be integrated through an adhesive member. In this case, the adhesive member may include a non-conductive component. Therefore, at least a portion of the adhesive member permeates into a gap between the plurality of micro-pieces constituting each of the ribbon sheets to entirely or partially insulate adjacent micro-pieces.

However, the first sheet layer 121 or 121' is not limited to the above-described types, and it should be understood that any material having a magnetic property may be used.

In addition, the second sheet layer 122 for improving the performance of the near field communication antenna which operates in the second frequency band may be also flaked and divided into a plurality of pieces. For example, when the second sheet layer 122 is made of a ferrite sheet having a high brittleness, the ferrite sheet may be divided into a plurality of micro-pieces to increase flexibility of the sheet itself and to minimize changes of characteristics of the sheet itself due to cracking and division.

A micro-piece separation and oxidation preventing member 130, 130', 130", or 230 is provided on an exposed surface of a magnetic field shielding sheet according to the present invention so that at least a portion of the exposed surface of the shielding sheet is not exposed to the outside.

Specifically, when the shielding sheet is made of a magnetic material including a metal component, the micro-piece separation and oxidation preventing member 130, 130', 130", or 230 may prevent a side surface of the shielding sheet corresponding to a stamped surface from being exposed to the outside to prevent oxidation of the side surface via contact with air and/or moisture, and may prevent separation of the micro-pieces of the metal component from the side surface to improve reliability of a product.

For example, when the first sheet layer 121 or 121' is made of a magnetic material including a metal component, such as a ribbon sheet including at least one of an amorphous alloy and a nanocrystalline alloy, side surface of the first sheet layer 121 or 121' may become stamped surfaces formed by a stamping process in a manufacturing process. Accordingly, when a micro-piece of a metal component, such as the ribbon pieces, is separated from the stamped surface, the separated micro-piece causes a short circuit in an electronic circuit.

In the present invention, when the first sheet layer 121 or 121' is made of a magnetic material including a metal component, such as a ribbon sheet including at least one of an amorphous alloy and a nanocrystalline alloy, the micro-piece separation and oxidation preventing member 130, 130', 130", or 230 is provided to surround the side surface of the first sheet layer 121 or 121' corresponding to the stamped surfaces, and micro-pieces of the metal component are prevented from being separated from the side surface of the first sheet layer 121 or 121', which are the stamped surfaces, by the micro-piece separation and oxidation preventing member 130, 130', 130", or 230.

Accordingly, even when the first sheet layer 121 or 121' is made of a material including a metal component, such as the ribbon sheet including at least one of the amorphous alloy and the nanocrystalline alloy, separation of the micro-pieces of the metal component from the side surfaces may be prevented, and the side surfaces may be prevented from being oxidized through contact with air and/or moisture. Therefore, reliability of a product may be increased, and a short circuit may be prevented from occurring in an electronic circuit due to the separated micro-piece of the metal component.

Here, an adhesive 134 applied to at least one surface of the micro-piece separation and oxidation preventing member 130, 130', 130", or 230 may be provided as an adhesive including a non-conductive component so that micro-pieces separated from the side surface of the first sheet layer 121 or 121' may be maintained in a state in which the micro-pieces are adhered to the stamped surface.

Also, the micro-piece separation and oxidation preventing member 130, 130', 130", or 230 may be provided in the form of a sheet of a protective film, and may be provided in the form in which a liquid-type or gel-type coating layer is applied to the side surface of the first sheet layer 121 or 121' through dipping, spraying, printing, or the like.

In addition, the micro-piece separation and oxidation preventing members 130, 130', 130", and 230 may be a polymer resin including at least one selected from the group consisting of a wax, an epoxy resin, a melamine resin, a silicone resin, an acrylic resin, an ethylene propylene rubber resin (EPDM), and a polyvinyl alcohol resin (PVA).

Meanwhile, when the micro-piece separation and oxidation preventing members 130, 130', 130", and 230 are provided in the form of a protective film, a fluororesin-based film such as PET film, polypropylene (PP) film, polyethylene terephthalate (PTFE), or the like may be used as the protective film.

The micro-piece separation and oxidation preventing member 130, 130', or 130" may include a second portion 132 which covers at least the side surface of the first sheet layer 121 or 121' as illustrated in FIGS. 1 and 2, and may include a first portion 131 which covers upper surfaces of the first sheet layer 121 or 121' for convenience of a manufacturing process and to increase adhesiveness.

Figure 2C:
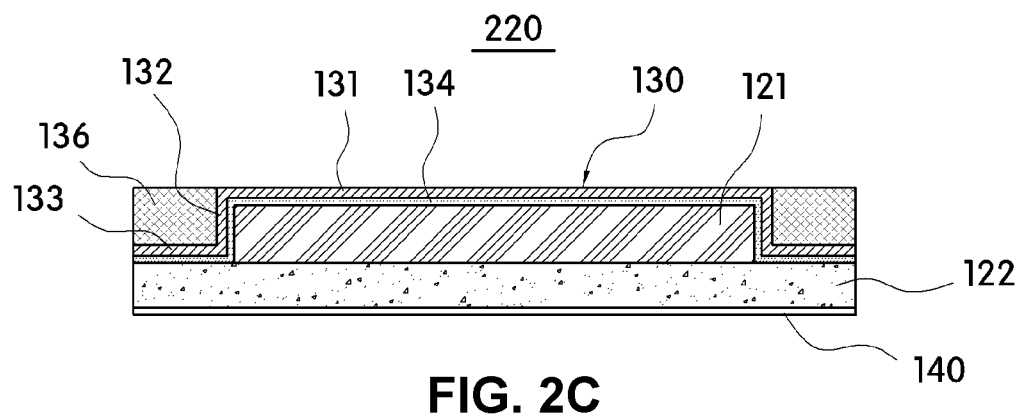
Figure 2D:
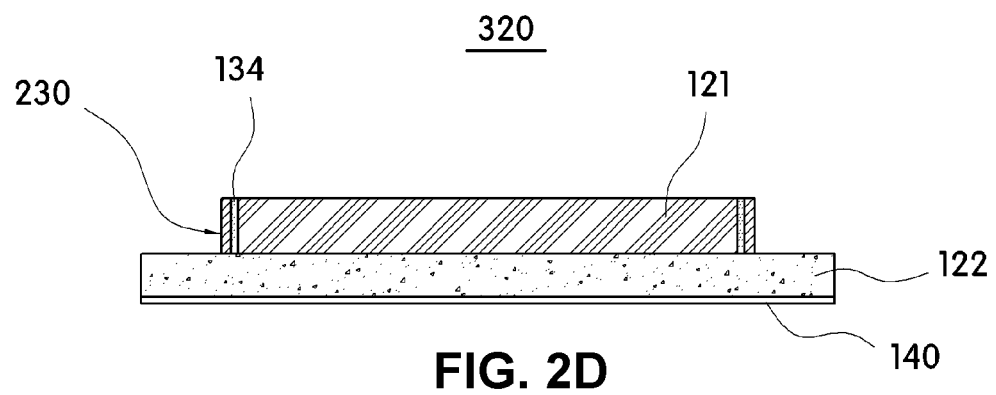

Also, the micro-piece separation and oxidation preventing member 230 may be provided to cover only the side surface of the first sheet layer 121 as illustrated in FIG. 2D.

In this case, when the first sheet layer 121 is provided to have a smaller size than the second sheet layer 122, the micro-piece separation and oxidation preventing member 130 may include a third portion 133 which extends from the second portion 132 and covers the upper surface of the second sheet layer 122 as illustrated in FIGS. 1 and 2C.

Accordingly, since the third portion 133 extends from the second portion 132, which covers the side surface of the first sheet layer 121, to the upper surface of the second sheet layer 122, an adhesive force of the protective film may be increased due to an increase of a contact area when the micro-piece separation and oxidation preventing member 130 is provided in the form of the protective film.

In addition, when the first sheet layer 121 is provided to have the same size as the second sheet layer 122, the micro-piece separation and oxidation preventing member 130" may extend from the second portion 132 to cover a side surface of the second sheet layer 122 as illustrated in FIG. 2B.

In this case, a portion which extends from the second portion 132 may extend to cover a portion of a lower surface of the second sheet layer 122 to increase an adhesive force of the micro-piece separation and oxidation preventing member 130" due to an increase of a contact area.

Also, when the buffer layer 136 is disposed on the side portion of the first sheet layer 121, the adhesive 134 may be applied to both surfaces of the second portion 132 and the third portion 133 of the micro-piece separation and oxidation preventing member 130, and the buffer layer 136 may be fixed thereto via the adhesive 134.

The micro-piece separation and oxidation preventing member 130, 130', or 130" is illustrated and described as being provided on the side surface of and/or the upper surface of the first sheet layer 121 and/or the second sheet layer 122 in the drawings and description, but the present invention is not limited thereto, and it should be understood that the micro-piece separation and oxidation preventing member 130, 130', or 130" may be provided to cover only the side surfaces of the first sheet layer 121 and the second sheet layer 122. In addition, it should be understood that the micro-piece separation and oxidation preventing member 130, 130', 130", or 230 may be applied to all exposed surfaces of a shielding sheet 120, 120', 120", or 220 in a process of applying the shielding sheet 120, 120', 120", or 220 to a product.

In addition, when both the first sheet layer 121 and the second sheet layer 122 are made of a magnetic material including a metal component, the micro-piece separation and oxidation preventing member 130, 130', or 130" is preferably disposed to cover all of the side surfaces of the first sheet layer 121 and the second sheet layer 122 (see FIG. 2B).

Meanwhile, a separate removable cover film 140 may be provided on a lower surface of the second sheet layer 122 on which the micro-piece separation and oxidation preventing member 130, 130', 130", or 230 is not disposed.

Also, it should be understood that the wireless power transfer module 100 may be manufactured to have a total thickness ranging from 0.15 to 0.6 mm according to a demand for light weight and shortening of an electronic device such as a portable terminal, and may be manufactured to have a thickness of 0.3 mm.

Here, although the total thickness of the wireless power transfer module 100 is exampled as ranging from 0.15 to 0.6 mm, it should be understood that the total thickness of the wireless power transfer module is a small thickness and is not limited to the total thickness of the wireless power transfer module.

Meanwhile, the antenna unit 110 is illustrated as being attached to one surface of the second sheet layer 122 of the shielding sheet in the drawings, but the present invention is not limited thereto, and it should be understood that the antenna unit 110 may be attached to one surface of the first sheet layer 121 or 121'.

Figure 6:
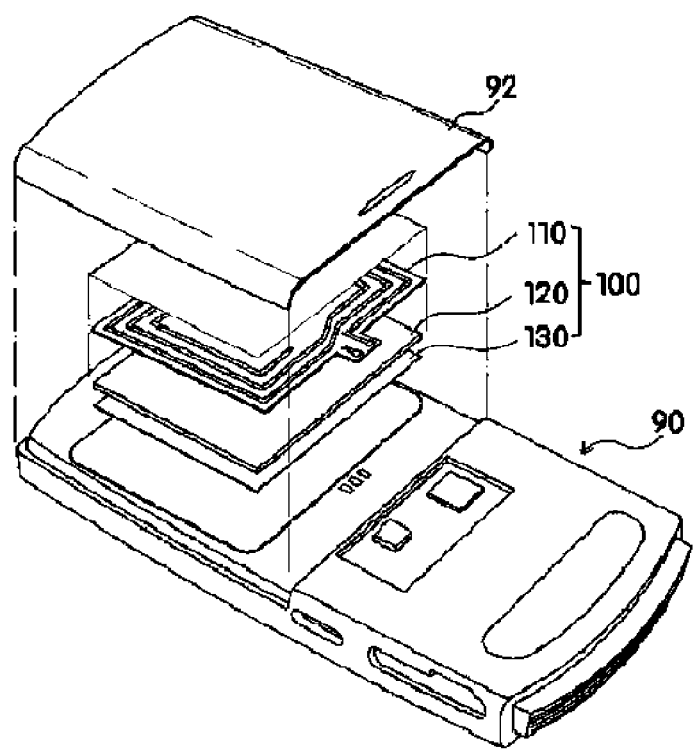
FIG. 6 is a schematic view illustrating a state in which the wireless power transfer module according to the embodiment of the present invention is applied to a portable terminal.

The wireless power transfer module 100 according to the embodiment of the present invention may be installed inside a rear case or back cover 92 of the portable terminal 90 as illustrated in FIG. 6, and may be installed in a case separately coupled to a portable terminal.

While the embodiments of the present invention have been described above in detail, it should be understood by those skilled in the art that the scope of the present invention is not limited thereto and includes various alterations, changes, modifications, and equivalents derived from the basic concept of the present invention defined in claims to be described.

The invention claimed is:

1. A magnetic field shielding sheet, which is applied to a combo-type antenna unit including at least two antennas using magnetic fields of different frequency bands, the magnetic field shielding sheet comprising:

a first sheet layer configured to shield a magnetic field of a first frequency band and concentrate the magnetic field in a designated direction and including a metal component;

a second sheet layer configured to shield a magnetic field of a second frequency band and concentrate the magnetic field in a designated direction; and a micro-piece separation and oxidation preventing member provided on a side surface of the first sheet layer, which is an exposed surface, to prevent separation of a micro-piece from the side surface of the first sheet layer or prevent oxidation of the side surface, wherein the side surface of the first sheet layer is a stamped surface.

2. The magnetic field shielding sheet of claim 1, wherein the micro-piece separation and oxidation preventing member is a protective film.

3. The magnetic field shielding sheet of claim 1, wherein the first sheet layer is provided to have the same size as the second sheet layer.

4. The magnetic field shielding sheet of claim 3, wherein the micro-piece separation and oxidation preventing member includes a first portion which covers an upper surface of the first sheet layer and a second portion which extends from the first portion to cover the side surface of the first sheet layer.

5. The magnetic field shielding sheet of claim 4, wherein the second portion extends to cover a side surface of the second sheet layer.

6. The magnetic field shielding sheet of claim 1, wherein the first sheet layer is provided to have a smaller size than the second sheet layer.

7. The magnetic field shielding sheet of claim 6, wherein the micro-piece separation and oxidation preventing member includes a first portion which covers an upper surface of the first sheet layer, a second portion which extends from the first portion to cover the side surface of the first sheet layer, and a third portion which extends from the second portion to cover a portion of the second sheet layer.

8. The magnetic field shielding sheet of claim 6, wherein a buffer layer is provided on an upper surface of the second sheet layer and disposed at a periphery of the first sheet layer to surround the first sheet layer, and the second sheet layer is provided to have a size equal to a sum of sizes of the first sheet layer and the buffer layer.

9. The magnetic field shielding sheet of claim 6, wherein the magnetic field of the first frequency band is for wireless power transfer, the magnetic field of the second frequency band is for near field communication, the first sheet layer is disposed to correspond to a wireless power transfer antenna, and the second sheet layer is disposed to correspond to a near field communication antenna.

10. The magnetic field shielding sheet of claim 1, wherein the first sheet layer and the second sheet layer are made of magnetic materials having different magnetic permeabilities.

11. The magnetic field shielding sheet of claim 1, wherein the first sheet layer is a ribbon sheet including at least one of an amorphous alloy and a nanocrystalline alloy, and the second sheet layer is a ferrite sheet or a polymer sheet.

12. The magnetic field shielding sheet of claim 11, wherein the ferrite sheet is made of a Mn—Zn ferrite or a Ni—Zn ferrite.

13. The magnetic field shielding sheet of claim 1, wherein the first sheet layer is formed by stacking ribbon sheets including at least one of an amorphous alloy and a nanocrystalline alloy in multiple layers.

14. The magnetic field shielding sheet of claim 1, wherein at least one or both of the first sheet layer and the second sheet layer are divided into a plurality of micro-pieces.

15. The magnetic field shielding sheet of claim 1, wherein the micro-piece separation and oxidation preventing member is attached via an adhesive including a non-conductive component.

16. A wireless power transfer module comprising:
an antenna unit including a wireless power transfer antenna and a near field communication antenna; and
the magnetic field shielding sheet according to claim 1, which is disposed on one surface of the antenna unit, shields a magnetic field generated by the antenna unit, and concentrates the magnetic field in a designated direction.

17. The wireless power transfer module of claim 16, wherein the antenna unit further includes a magnetic secure transmission (MST) antenna.

18. The wireless power transfer module of claim 16, wherein a total thickness of the wireless power transfer module ranges from 0.15 to 0.6 mm.

19. The wireless power transfer module of claim 18, wherein the total thickness of the wireless power transfer module is 0.3 mm.

20. A portable terminal comprising the wireless power transfer module according to claim 16.

* * * * *